United States Patent
Chien

(10) Patent No.: US 10,852,601 B2
(45) Date of Patent: Dec. 1, 2020

(54) DISPLAY PANEL AND METHOD OF MANUFACTURING THE SAME

(71) Applicants: HKC CORPORATION LIMITED, Shenzhen (CN); CHONGQING HKC OPTOELECTRONICS TECHNOLOGY CO., LTD., Chongqing (CN)

(72) Inventor: Chung-Kuang Chien, Chongqing (CN)

(73) Assignees: HKC Corporation Limited, Shenzhen (CN); Chongqing HKC Optoelectronics Technology Co., Ltd., Chongqing (CN)

( * ) Notice: Subject to any disclaimer, the term of this patent is extended or adjusted under 35 U.S.C. 154(b) by 0 days.

(21) Appl. No.: 16/336,976

(22) PCT Filed: Jun. 20, 2017

(86) PCT No.: PCT/CN2017/089176
§ 371 (c)(1),
(2) Date: Mar. 27, 2019

(87) PCT Pub. No.: WO2018/157507
PCT Pub. Date: Sep. 7, 2018

(65) Prior Publication Data
US 2019/0219877 A1    Jul. 18, 2019

(30) Foreign Application Priority Data

Mar. 3, 2017  (CN) .......................... 2017 1 0122563

(51) Int. Cl.
*G02F 1/1362* (2006.01)
*G02F 1/1339* (2006.01)
*G02F 1/1343* (2006.01)
*G02F 1/13* (2006.01)
*G02F 1/1368* (2006.01)
*H01L 27/12* (2006.01)

(52) U.S. Cl.
CPC ...... *G02F 1/136259* (2013.01); *G02F 1/1309* (2013.01); *G02F 1/1339* (2013.01); *G02F 1/13439* (2013.01); *G02F 1/134309* (2013.01); *G02F 1/1368* (2013.01); *G02F 2001/1316* (2013.01); *H01L 27/1214* (2013.01); *H01L 27/1292* (2013.01); *H01L 2251/568* (2013.01)

(58) Field of Classification Search
CPC ........... H01L 2251/568; H01L 27/1214; G02F 1/1309
See application file for complete search history.

(56) References Cited

U.S. PATENT DOCUMENTS

| | | | | |
|---|---|---|---|---|
| 2004/0211941 | A1* | 10/2004 | Miyoshi | ................. C01G 15/00 252/500 |
| 2004/0227897 | A1* | 11/2004 | Wu | .......................... H01J 9/02 349/192 |
| 2006/0226865 | A1* | 10/2006 | Gallarda | ............... G02F 1/1309 349/192 |

* cited by examiner

*Primary Examiner* — Caridad Everhart
(74) *Attorney, Agent, or Firm* — Wang Law Firm, Inc.

(57) ABSTRACT

A display panel and a method of manufacturing the same are provided. The display panel includes a substrate and an electrode layer. The electrode layer is disposed on the substrate. The electrode layer is provided with a first defect seat and a transparent conductive patch layer. The transparent conductive patch layer overlies the first defect seat.

18 Claims, 6 Drawing Sheets

DISPLAY PANEL AND METHOD OF MANUFACTURING THE SAME

FIELD OF THE INVENTION

The present invention relates to the display technology, and more particularly to a display panel and a method of manufacturing the same.

BACKGROUND OF THE INVENTION

A liquid crystal display has the advantages of a thin body, energy-saving, no radiation and so on. Therefore, it has been widely used. Most of the liquid crystal displays on the market are in the form of backlight, including a liquid crystal panel and a backlight module. The liquid crystal panel includes two parallel glass substrates and liquid crystals disposed between the two parallel glass substrates. The two glass substrates are applied with a driving voltage for controlling the direction of rotation of the liquid crystals to reflect the light from the backlight module so as to produce a picture.

A thin film transistor liquid crystal display (TFT-LCD) is now in a dominant position in the display field because of its low power consumption, excellent picture quality, high production yield, and other performances. Similarly, the thin film transistor liquid crystal display includes a liquid crystal panel and a backlight module. The liquid crystal panel includes a color filter substrate (CF substrate), a thin film transistor substrate (TFT substrate), and a mask. A transparent electrode is provided between opposite inner sides of the two substrates. A layer of liquid crystals is sandwiched between the two substrates.

However, after the photo spacer (PS) is set, it is usually in need of repair. For example, a foreign matter is adhered, and the adhesion between the foreign matter and the substrate is poor. The removal of the foreign matter is likely to peel off a portion of the electrode layer to result in defects or other circumstances that cause the electrode layer to partially peel off, so that the liquid crystal in the vicinity of the defective area cannot operate normally. The color filter substrate and/or the array substrate have no Vcom potential, and the potential appears floating. There is a problem of poor alignment, such as partial black or anomaly. As a result, the display image quality is not good.

SUMMARY OF THE INVENTION

The primary object of the present invention is to provide a display panel having a high success rate of patching and normal alignment.

In addition, the present invention further provides a method of manufacturing the display device.

Additionally, the present invention further provides a display device.

The purpose of the present invention is embodied by the following technical policy:

A display panel is provided. The display panel includes a substrate and an electrode layer. The electrode layer is disposed on the substrate. The electrode layer is provided with a first defect seat and transparent conductive patch layer. The transparent conductive patch layer overlies the first defect seat.

Preferably, the transparent conductive patch layer employs a colloidal material. A colloid also known as colloidal dispersion is an even mixture. A colloid has a dispersed phase and a continuous phase. The dispersed-phase particles are composed of tiny particles or droplets. The dispersed-phase particles have a diameter between approximately 1 and 1000 nanometers. The diameter of the dispersed-phase particles of the colloid is between coarse dispersion and a solution. The colloid is highly dispersed multi-phase dispersion.

Preferably, the composition of the colloidal material is indium oxide, tin oxide, zinc oxide, or a mixture thereof. Indium oxide is a new n-type transparent semiconductor functional material with a wide forbidden bandwidth, a smaller resistivity and a higher catalytic activity. Tin oxide is an excellent transparent conductive material. In order to improve its conductivity and stability, it is often used for doping. The bandgap and exciton binding energy of zinc oxide is large, and zinc oxide has high transparency and excellent luminescent property at a normal temperature.

Preferably, the display panel further includes a first photoresist layer. The first photoresist layer overlies a surface of the electrode layer. The first photoresist layer is provided with a second defect seat and a first photoresist patch layer corresponding in position to the first defect seat. When the first photoresist layer overlies the surface of the electrode layer, the second defect seat corresponds in position to the first defect seat. The transparent conductive patch layer overlies the first defect seat for patching. The first photoresist patch layer overlies the second defect seat for patching.

Preferably, the display panel further includes a second photoresist layer. The electrode layer overlies a surface of the second photoresist layer. The second photoresist layer is provided with a third defect seat and a second photoresist patch layer corresponding in position to the first defect seat. When the electrode layer overlies the surface of the second photoresist layer, the third defect seat corresponds in position to the first defect seat. The second photoresist patch layer overlies the third defect seat for patching. The transparent conductive patch layer overlies the first defect seat for patching.

Preferably, the substrate includes a first substrate. The first substrate is provided with an active switch. The electrode layer includes a pixel electrode layer coupled to the active switch. The pixel electrode layer is provided with the first defect seat and the transparent conductive patch layer. The first defect seat and the transparent conductive patch layer are provided on the pixel electrode layer in a specific setting of the display panel.

Preferably, the substrate includes a second substrate. The electrode layer includes a common electrode layer overlying the second substrate. The common electrode layer is provided with the first defect seat and the transparent conductive patch layer. The first defect seat and the transparent conductive patch layer are provided on the common electrode layer in a specific setting of the display panel.

According to another aspect of the present invention, a method of manufacturing a display panel is provided. The display panel includes a substrate. The method includes the steps of: providing an electrode layer on the substrate; the electrode layer having a first defect seat, a transparent conductive patch layer overlying the first defect seat.

Preferably, the method of manufacturing the display panel employs an ink coating method. The ink coating method has an excellent adhesion effect, and the operation process is simple, not prone to shedding and light leakage.

According to a further aspect of the present invention, a display device is provided. The display device includes a backlight module and a display panel as described above.

The first defect seat of the electrode layer is directly patched with the transparent conductive patch layer, so that the electrode layer can restore the normal operating function to solve the problem of poor alignment and to provide a better display image quality and to increase the success rate of patching and to avoid production scraps because of excessive defects.

BRIEF DESCRIPTION OF THE DRAWINGS

These and/or other aspects will become apparent and more readily appreciated from the following description of the embodiments, taken in conjunction with the accompanying drawings, in which.

DESCRIPTION OF THE PREFERRED EMBODIMENTS

Figure 1:
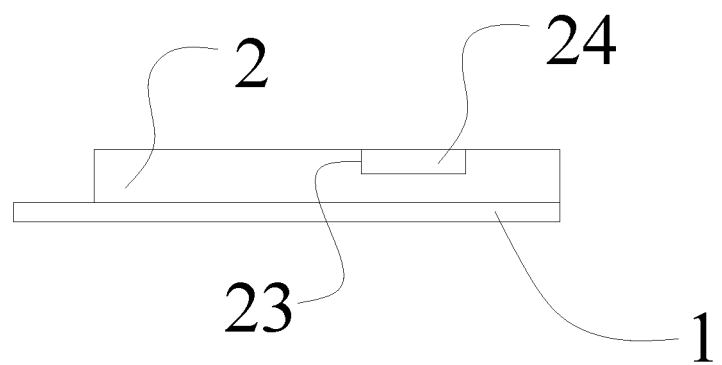
FIG. 1 is a schematic view of a display panel in accordance with an embodiment of the present invention.

Advantages and features of the inventive concept and methods of accomplishing the same may be understood more readily by reference to the following detailed description of embodiments and the accompanying drawings. The inventive concept may, however, be embodied in many different forms and should not be construed as being limited to the embodiments set forth herein.

Throughout the description of the present disclosure, spatially relative terms, such as "center," "transverse," "upper," "lower," "left," "right," "front," "rear," "vertical," "horizontal," "top," "bottom," "inner," "outer" and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. It will be understood that, although the terms "first," "second" etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. Throughout the description of the present disclosure, unless the context clearly indicates otherwise, the meaning of "plural" is two or more. In addition, the terms "comprise," "comprising," "includes," "including," and the like are intended to cover non-exclusive inclusion.

Throughout the description of the present disclosure, it should be understood that the terms "installed," "connected," and "coupled" should be broadly interpreted, unless the context clearly indicates otherwise, for example, it may be fixedly connected, detachably connected, or integrally connected; it be a mechanically connected or electrically connected; it may be directly connected or indirectly connected through an intermediate medium; it be an internal connection of two components. It will be apparent to those skilled in the art that the specific meaning of the above terms in this description.

The terminology used herein is for the purpose of describing particular embodiments only and is not intended to be limiting of the present invention. As used herein, the singular forms "a," "an," and "the" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof.

Embodiments of the present invention will now be described, by way of example only, with reference to the accompanying drawings.

As shown in FIG. 1, the display panel in accordance with an embodiment of the present invention includes a substrate 1 and an electrode layer 2. The electrode layer 2 is disposed on the substrate 1. The electrode layer 2 is provided with a first defect seat 23 and a transparent conductive patch layer 24. The transparent conductive patch layer 24 overlies the first defect seat 23. Since the first defect seat 23 of the electrode layer 2 is directly patched with the transparent conductive patch layer 24, so that the electrode layer 2 can restore the normal operating function to solve the problem of poor alignment and to provide a better display image quality and to increase the success rate of patching and to avoid production scraps because of excessive defects.

Specifically, the transparent conductive patch layer 24 employs a colloidal material. A colloid also known as colloidal dispersion is an even mixture. A colloid has a dispersed phase and a continuous phase. The dispersed-phase particles are composed of tiny particles or droplets. The dispersed-phase particles have a diameter between approximately 1 and 1000 nanometers. The diameter of the dispersed-phase particles of the colloid is between coarse dispersion and a solution. The colloid is highly dispersed multi-phase dispersion. The electrode layer 2 includes indium tin oxide (ITO), indium zinc oxide (IZO) or other transparent conductive material. Therefore, the composition of the transparent conductive patch layer 24 may be, for example, transparent conductive particles, a solvent, or the like.

Specifically, the composition of the colloidal material is indium oxide, tin oxide, zinc oxide, or a mixture thereof. Indium oxide is a new n-type transparent semiconductor functional material with a wide forbidden bandwidth, a smaller resistivity and a higher catalytic activity. Tin oxide is an excellent transparent conductive material. In order to improve its conductivity and stability, it is often used for doping. The bandgap and exciton binding energy of zinc oxide is large, and zinc oxide has high transparency and excellent luminescent property at a normal temperature. Representative TCO materials are indium oxide, tin oxide, zinc oxide, cadmium oxide, indium cadmium tetroxide ($In_2CdO_4$), tin cadmium tetroxide ($SnCd_2O_4$), tin zinc tetroxide ($SnZn_2O_4$), indium oxide-tin oxide, and the like. The energy gap of these oxide semiconductors is above 3 eV, so the energy of visible light (about 1.6-3.3 eV) is not sufficient to excite the electrons of the valence band to the conduction band, only the light with the wavelength below 350-400 nm (ultraviolet) can do so. Thus, the light absorption generated by the migration of electrons between the energy bands does not occur in the visible range, and the TCO is transparent to the visible light. If Sn (as ITO) is further added to the indium oxide, Sb and F is added to the tin oxide, or a dopant such as In, Ga (GZO) or Al (AZO) is added to the ZnO, the carrier concentration is increased to 10-10 cm, the resistance can be decreased. These dopants, for example, Sn which has a qudrivalent position in ITO, is substituted for the trivalent in position. In GZO or AZO, the trivalent Ga or Al is substituted for the divalent Zn in position so that a dopant atom can provide a carrier. However, in reality, not all dopants are such replacement type solution. They may exist in the lattice as neutral atoms to become a scattering center, or segregate in the grain boundary or surface. The effectively formation of the replacement type solution for enhancing the efficiency of doping and lowering resistance is very important for the production of transparent conductive films.

Figure 2:
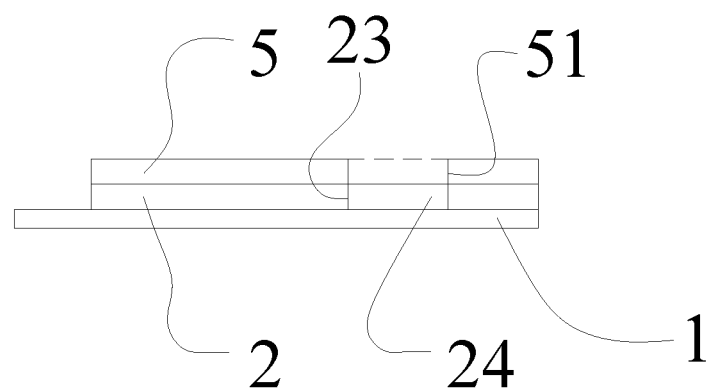
FIG. 2 is a schematic view of a display panel in accordance with an embodiment of the present invention.

As shown in FIG. 2, the display panel in accordance with another embodiment of the present invention includes a substrate 1 and an electrode layer 2. The electrode layer 2 is disposed on the substrate 1. The electrode layer 2 is provided with a first defect seat 23 and a transparent conductive patch layer 24. The transparent conductive patch layer 24 overlies the first defect seat 23. The display panel includes a first photoresist layer 5. The first photoresist layer 5 overlies the surface of the electrode layer 2. The first photoresist layer 5 is provided with a second defect seat 51 and a first photoresist patch layer corresponding in position to the first defect seat 23.

Specifically, the transparent conductive patch layer 24 employs a colloidal material. A colloid also known as colloidal dispersion is a mixture. A colloid has a dispersed phase and a continuous phase. The dispersed-phase particles are composed of tiny particles or droplets. The dispersed-phase particles have a diameter between approximately 1 and 1000 nanometers. The diameter of the dispersed-phase particles of the colloid is between coarse dispersion and a solution. This is a highly dispersed multi-phase dispersion. The electrode layer 2 includes indium tin oxide (ITO), indium zinc oxide (IZO) or other transparent conductive material. Therefore, the composition of the transparent conductive patch layer 24 may be, for example, transparent conductive particles, a solvent, or the like.

Specifically, the composition of the colloidal material is indium oxide, tin oxide, zinc oxide, or a mixture of the foregoing. Indium oxide is a new n-type transparent semiconductor functional material with a wide forbidden bandwidth, a smaller resistivity and a higher catalytic activity. Tin oxide is a good transparent conductive material. In order to improve its conductivity and stability, it is often used for doping. The bandgap and exciton binding energy of zinc oxide is large, and zinc oxide has high transparency and excellent luminescent property at a normal temperature. Representative TCO materials are indium oxide, tin oxide, zinc oxide, cadmium oxide, indium cadmium tetroxide ($In_2CdO_4$), tin cadmium tetroxide ($SnCd_2O_4$), tin zinc tetroxide ($SnZn_2O_4$), indium oxide-tin oxide, and the like. The energy gap of these oxide semiconductors is above 3 eV, so the energy of visible light (about 1.6-3.3 eV) is not sufficient to excite the electrons of the valence band to the conduction band, only the light with the wavelength below 350-400 nm (ultraviolet) can do so. Thus, the light absorption generated by the migration of electrons between the energy bands does not occur in the visible range, and the TCO is transparent to the visible light. If Sn (as ITO) is further added to the indium oxide, Sb and F is added to the tin oxide, or a dopant such as In, Ga (GZO) or Al (AZO) is added to the ZnO, the carrier concentration is increased to 10-10 cm, the resistance can be decreased. These dopants, for example, Sn which has a qudrivalent position in ITO, is substituted for the trivalent in position. In GZO or AZO, the trivalent Ga or Al is substituted for the divalent Zn in position so that a dopant atom can provide a carrier. However, in reality, not all dopants are such replacement type solution. They may exist in the lattice as neutral atoms to become a scattering center, or segregate in the grain boundary or surface. The effectively formation of the replacement type solution for enhancing the efficiency of doping and lowering resistance is very important for the production of transparent conductive films.

Specifically, the first photoresist patch layer employs a color photoresist patch layer, and/or the first photoresist patch layer employs a black photoresist patch layer. The second defect seat 51 is restored to the color exhibited by the original pixel in the electrode layer 2 through the color and/or black photoresist patch layer to improve the display image quality. The color photoresist, such as RGB, but not limited to R pixel, G pixel, B pixel, which may include W (white) pixel, Y (yellow) pixel and other colors to provide rich colors and a better display effect.

Figure 3:
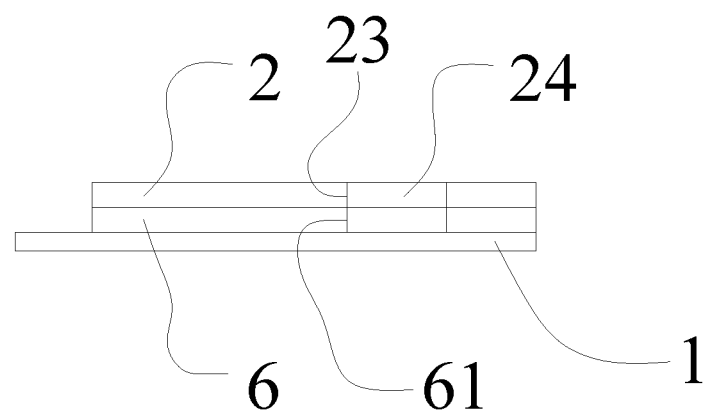
FIG. 3 is a schematic view of a display panel in accordance with an embodiment of the present invention.

As shown in FIG. 3, the display panel in accordance with still another embodiment of the present invention includes a substrate 1 and an electrode layer 2. The electrode layer 2 is disposed on the substrate 1. The electrode layer 2 is provided with a first defect seat 23 and a transparent conductive patch layer 24. The transparent conductive patch layer 24 overlies the first defect seat 23. The display panel includes a second photoresist layer 6. The electrode layer 2 overlies the surface of the second photoresist layer 6. The second photoresist layer 6 is provided with a third defect seat 61 and a second photoresist patch layer corresponding in position to the first defect seat 23.

Specifically, the transparent conductive patch layer 24 employs a colloidal material. A colloid also known as colloidal dispersion is a mixture. A colloid has a dispersed phase and a continuous phase. The dispersed-phase particles are composed of tiny particles or droplets. The dispersed-phase particles have a diameter between approximately 1 and 1000 nanometers. The diameter of the dispersed-phase particles of the colloid is between coarse dispersion and a solution. This is a highly dispersed multi-phase dispersion. The electrode layer 2 includes indium tin oxide (ITO), indium zinc oxide (IZO) or other transparent conductive material. Therefore, the composition of the transparent conductive patch layer 24 may be, for example, transparent conductive particles, a solvent, or the like.

Specifically, the composition of the colloidal material is indium oxide, tin oxide, zinc oxide, or a mixture of the foregoing. Indium oxide is a new n-type transparent semiconductor functional material with a wide forbidden bandwidth, a smaller resistivity and a higher catalytic activity. Tin oxide is a good transparent conductive material. In order to improve its conductivity and stability, it is often used for doping. The bandgap and exciton binding energy of zinc oxide is large, and zinc oxide has high transparency and excellent luminescent property at a normal temperature. Representative TCO materials are indium oxide, tin oxide, zinc oxide, cadmium oxide, indium cadmium tetroxide ($In_2CdO_4$), tin cadmium tetroxide ($SnCd_2O_4$), tin zinc tetroxide ($SnZn_2O_4$), indium oxide-tin oxide, and the like. The energy gap of these oxide semiconductors is above 3 eV, so the energy of visible light (about 1.6-3.3 eV) is not sufficient to excite the electrons of the valence band to the conduction band, only the light with the wavelength below 350-400 nm (ultraviolet) can do so. Thus, the light absorption generated by the migration of electrons between the energy bands does not occur in the visible range, and the TCO is transparent to the visible light. If Sn (as ITO) is further added to the indium oxide, Sb and F is added to the tin oxide, or a dopant such as In, Ga (GZO) or Al (AZO) is added to the ZnO, the carrier concentration is increased to 10-10 cm, the resistance can be decreased. These dopants, for example, Sn which has a qudrivalent position in ITO, is substituted for the trivalent in position. In GZO or AZO, the trivalent Ga or Al is substituted for the divalent Zn in position so that a dopant atom can provide a carrier. However, in reality, not all dopants are such replacement type solution. They may exist in the lattice as neutral atoms to become a scattering center, or segregate in the grain boundary or surface. The effectively formation of the replacement type solution for enhancing the efficiency of doping and lowering resistance is very important for the production of transparent conductive films.

Specifically, the second photoresist patch layer employs a color photoresist patch layer, and/or the second photoresist patch layer employs a black photoresist patch layer. The third defect seat 61 is restored to the color exhibited by the original pixel in the electrode layer 2 through the color and/or black photoresist patch layer to improve the display image quality. The color photoresist, such as RGB, but not limited to R pixel, G pixel, B pixel, which may include W (white) pixel, Y (yellow) pixel and other colors to provide rich colors and a better display effect.

Figure 5:
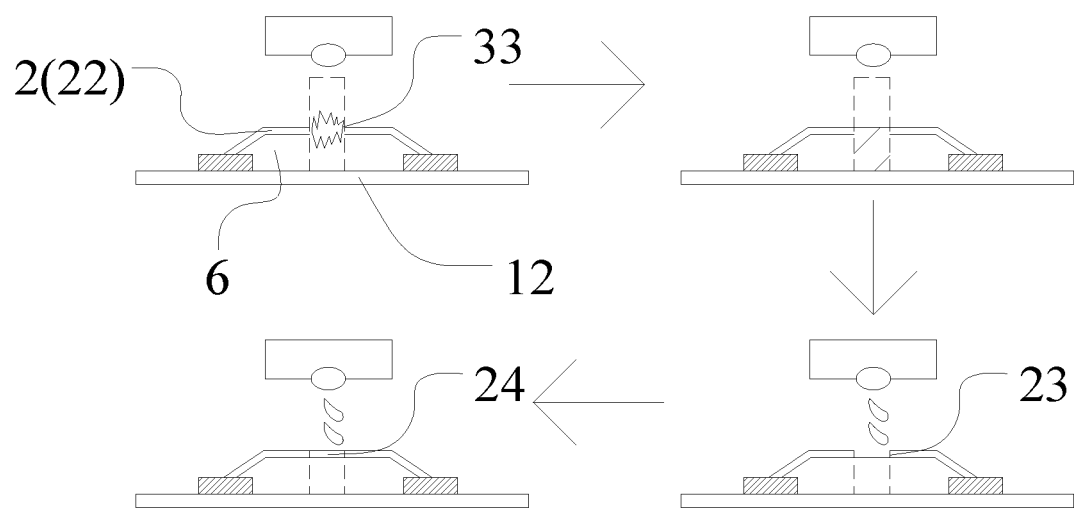
FIG. 5 is a schematic view of a display panel in accordance with an embodiment of the present invention.
Figure 6:
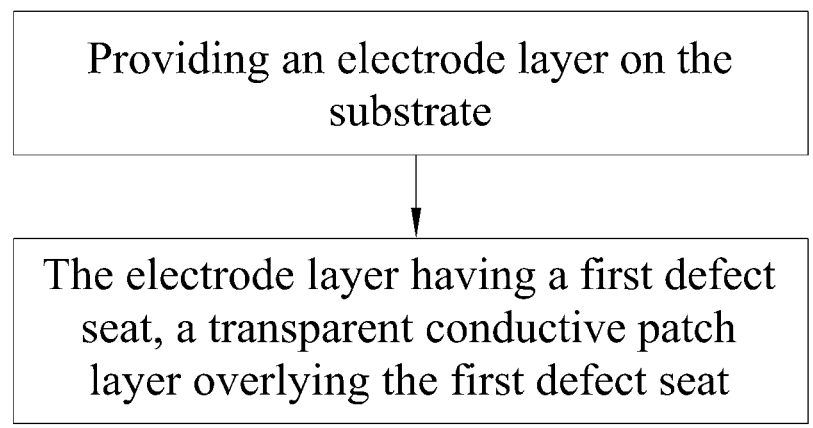
FIG. 6 is a flow chart of a method of manufacturing a display panel in accordance with an embodiment of the present invention.

Specifically, as shown in FIG. 5, the upper left corner of the figure shows that an ink coating patch is applied to the foreign matter 33. The upper right corner of the figure shows that the foreign matter 33 is removed by laser, and the corresponding position of the electrode layer 2 and the second photoresist layer 6 is also destructed and removed. The lower right corner of the figure shows that the second photoresist layer 6 is patched with the second photoresist patch layer. The lower left corner of the figure shows that the electrode layer 2 is patched with the transparent conductive layer 24. In this way, the first defect seat 23 still has the alignment capability. This step can be easily performed regardless of the size or shape of the first defect seat 23.

Figure 4:
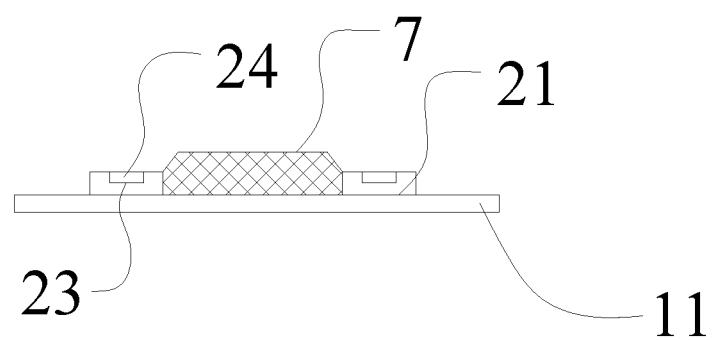
FIG. 4 is a schematic view of a display panel in accordance with an embodiment of the present invention.

As shown in FIG. 4, the display panel in accordance with still another embodiment of the present invention includes a substrate 1 and an electrode layer 2. The electrode layer 2 is disposed on the substrate 1. The electrode layer 2 is provided with a first defect seat 23 and a transparent conductive patch layer 24. The transparent conductive patch layer 24 overlies the first defect seat 23. The substrate 1 includes a first substrate 11. The first substrate 11 is provided with an active switch 7. The electrode layer 2 includes a pixel electrode layer 21 coupled to the active switch 7. The pixel electrode layer 21 is provided with the first defect seat 23 and the transparent conductive patch layer 24.

Specifically, the transparent conductive patch layer 24 employs a colloidal material. A colloid also known as colloidal dispersion is a mixture. A colloid has a dispersed phase and a continuous phase. The dispersed-phase particles are composed of tiny particles or droplets. The dispersed-phase particles have a diameter between approximately 1 and 1000 nanometers. The diameter of the dispersed-phase particles of the colloid is between coarse dispersion and a solution. This is a highly dispersed multi-phase dispersion. The electrode layer 2 includes indium tin oxide (ITO), indium zinc oxide (IZO) or other transparent conductive material. Therefore, the composition of the transparent conductive patch layer 24 may be, for example, transparent conductive particles, a solvent, or the like.

Specifically, the composition of the colloidal material is indium oxide, tin oxide, zinc oxide, or a mixture of the foregoing. Indium oxide is a new n-type transparent semiconductor functional material with a wide forbidden bandwidth, a smaller resistivity and a higher catalytic activity. Tin oxide is a good transparent conductive material. In order to improve its conductivity and stability, it is often used for doping. The bandgap and exciton binding energy of zinc oxide is large, and zinc oxide has high transparency and excellent luminescent property at a normal temperature. Representative TCO materials are indium oxide, tin oxide, zinc oxide, cadmium oxide, indium cadmium tetroxide ($In_2CdO_4$), tin cadmium tetroxide ($SnCd_2O_4$), tin zinc tetroxide ($SnZn_2O_4$), indium oxide-tin oxide, and the like. The energy gap of these oxide semiconductors is above 3 eV, so the energy of visible light (about 1.6-3.3 eV) is not sufficient to excite the electrons of the valence band to the conduction band, only the light with the wavelength below 350-400 nm (ultraviolet) can do so. Thus, the light absorption generated by the migration of electrons between the energy bands does not occur in the visible range, and the TCO is transparent to the visible light. If Sn (as ITO) is further added to the indium oxide, Sb and F is added to the tin oxide, or a dopant such as In, Ga (GZO) or Al (AZO) is added to the ZnO, the carrier concentration is increased to 10-10 cm, the resistance can be decreased. These dopants, for example, Sn which has a qudrivalent position in ITO, is substituted for the trivalent in position. In GZO or AZO, the trivalent Ga or Al is substituted for the divalent Zn in position so that a dopant atom can provide a carrier. However, in reality, not all dopants are such replacement type solution. They may exist in the lattice as neutral atoms to become a scattering center, or segregate in the grain boundary or surface. The effectively formation of the replacement type solution for enhancing the efficiency of doping and lowering resistance is very important for the production of transparent conductive films.

Specifically, the active switch 7 may employ a thin film transistor (TFT).

The display panel in accordance with still another embodiment of the present invention includes a substrate 1 and an electrode layer 2. The electrode layer 2 is disposed on the substrate 1. The electrode layer 2 is provided with a first defect seat 23 and a transparent conductive patch layer 24. The transparent conductive patch layer 24 overlies the first defect seat 23. The substrate 1 includes a second substrate 12. The electrode layer 2 includes a common electrode layer 22 overlying the second substrate 12. The common electrode layer 22 is provided with the first defect seat 23 and the transparent conductive patch layer 24. The first defect seat 23 and the transparent conductive patch layer 24 are provided on the common electrode layer 22 in a specific setting of the display panel.

Specifically, the transparent conductive patch layer 24 employs a colloidal material. A colloid also known as colloidal dispersion is a mixture. A colloid has a dispersed phase and a continuous phase. The dispersed-phase particles are composed of tiny particles or droplets. The dispersed-phase particles have a diameter between approximately 1 and 1000 nanometers. The diameter of the dispersed-phase particles of the colloid is between coarse dispersion and a solution. This is a highly dispersed multi-phase dispersion. The electrode layer 2 includes indium tin oxide (ITO), indium zinc oxide (IZO) or other transparent conductive material. Therefore, the composition of the transparent conductive patch layer 24 may be, for example, transparent conductive particles, a solvent, or the like.

Specifically, the composition of the colloidal material is indium oxide, tin oxide, zinc oxide, or a mixture of the foregoing. Indium oxide is a new n-type transparent semiconductor functional material with a wide forbidden bandwidth, a smaller resistivity and a higher catalytic activity. Tin oxide is a good transparent conductive material. In order to improve its conductivity and stability, it is often used for doping. The bandgap and exciton binding energy of zinc oxide is large, and zinc oxide has high transparency and excellent luminescent property at a normal temperature. Representative TCO materials are indium oxide, tin oxide, zinc oxide, cadmium oxide, indium cadmium tetroxide ($In_2CdO_4$), tin cadmium tetroxide ($SnCd_2O_4$), tin zinc tetroxide ($SnZn_2O_4$), indium oxide-tin oxide, and the like. The energy gap of these oxide semiconductors is above 3 eV, so the energy of visible light (about 1.6-3.3 eV) is not sufficient to excite the electrons of the valence band to the conduction band, only the light with the wavelength below 350-400 nm (ultraviolet) can do so. Thus, the light absorption generated by the migration of electrons between the energy bands does not occur in the visible range, and the TCO is transparent to the visible light. If Sn (as ITO) is further added to the indium oxide, Sb and F is added to the tin oxide, or a dopant such as In, Ga (GZO) or Al (AZO) is added to the ZnO, the carrier concentration is increased to 10-10 cm, the resistance can be decreased. These dopants, for example, Sn which has a qudrivalent position in ITO, is substituted for the trivalent in position. In GZO or AZO, the trivalent Ga or Al is substituted for the divalent Zn in position so that a dopant atom can provide a carrier. However, in reality, not all dopants are such replacement type solution. They may exist in the lattice as neutral atoms to become a scattering center, or segregate in the grain boundary or surface. The effectively formation of the replacement type solution for enhancing the efficiency of doping and lowering resistance is very important for the production of transparent conductive films.

A method of manufacturing a display panel in accordance with an embodiment of the present invention, includes the steps of:

providing a substrate 1 and an electrode layer 2, the electrode layer 2 being disposed on the substrate 1;

the electrode layer 2 having a first defect seat 23, a transparent conductive patch layer 24 overlying the first defect seat 23.

The method of manufacturing the display panel employs an ink coating method. The ink coating method has an excellent adhesion effect, and the operation process is simple, not prone to shedding and light leakage. It is also possible to use a chemical vapor deposition sputtering conductive patch in the manufacturing method. The CVD (chemical vapor deposition) method, which leads to gas phase reaction at high temperatures, was developed as a means of coating. However, it is not only used for the coating of heat-resistant materials but also for high purity metal refining, powder synthesis, semiconductor films and so on. The deposition temperature is low and the film composition is easy to control, the film thickness is proportional to the deposition time, the uniformity and the repeatability is good and the step coverage is excellent. Similarly, a physical vapor deposition (PVD) method may be also used, which realizes material transfer through a physical process, which transfers the atoms or molecules from the source to the substrate surface. Its function is to spray some particles with special properties (high strength, wear resistance, heat dissipation, corrosion resistance, etc.) on the precursor with lower performance to improve its performance. PVD basic methods: vacuum evaporation, sputtering, ion plating (hollow cathode ion plating, hot cathode ion plating, arc ion plating, activated reactive ion plating, radio frequency ion plating and DC discharge ion plating).

As a further embodiment of the present application, a display device in accordance with this embodiment of the present invention includes a backlight module and a display panel as described above.

It is to be noted that in the aforesaid embodiments, the material of the substrate 1 may be glass, plastic, or the like.

In the aforesaid embodiments, the display panel includes a liquid crystal panel, an OLED panel, a curved display panel, a plasma panel, etc. A liquid crystal panel is taken as an example. The liquid crystal panel includes an array substrate and a color filter substrate. The array substrate faces the color filter substrate. Liquid crystals and a photo (PS) are provided between the array substrate and the color filter substrate. The array substrate is provided with a thin film transistor (TFT). The color filter substrate is provided with a color filter layer.

In an embodiment, the color filter and the thin film transistor (TFT) may be formed on the same substrate. The array substrate may include the color filter layer.

Although particular embodiments of the present invention have been described in detail for purposes of illustration, various modifications and enhancements may be made without departing from the spirit and scope of the present invention. Accordingly, the present invention is not to be limited except as by the appended claims.

What is claimed is:

1. A display panel, comprising:
a substrate;
an electrode layer disposed on the substrate;
wherein the electrode layer is provided with a first defect seat and a transparent conductive patch layer, the transparent conductive patch layer overlying the first defect seat; the transparent conductive patch layer employing a colloidal material, the colloidal material being indium oxide, tin oxide, zinc oxide, or a mixture thereof;
wherein the display panel further comprises a first photoresist layer, the first photoresist layer overlying a surface of the electrode layer, the first photoresist layer being provided with a second defect seat and a first photoresist patch layer corresponding in position to the first defect seat; or the display panel further comprising a second photoresist layer, the electrode layer overlying a surface of the second photoresist layer, the second photoresist layer being provided with a third defect seat and a second photoresist patch layer corresponding in position to the first defect seat;
wherein the substrate comprises a first substrate, the first substrate being provided with an active switch; the electrode layer comprising a pixel electrode layer coupled to the active switch; the pixel electrode layer being provided with the first defect seat and the transparent conductive patch layer; the substrate comprising a second substrate, the electrode layer comprising a common electrode layer overlying the second substrate; the common electrode layer being provided with the first defect seat and the transparent conductive patch layer.

2. A display panel, comprising:
a substrate;
an electrode layer disposed on the substrate;
wherein the electrode layer is provided with a first defect seat and a transparent conductive patch layer, the transparent conductive patch layer overlying the first defect seat.

3. The display panel as claimed in claim 2, wherein the transparent conductive patch layer employs a colloidal material.

4. The display panel as claimed in claim 3, wherein the colloidal material is indium oxide, tin oxide, zinc oxide, or a mixture thereof.

5. The display panel as claimed in claim 2, wherein the transparent conductive patch layer employs a colloidal material, and the colloidal material is indium oxide, tin oxide, zinc oxide, or a mixture thereof.

6. The display panel as claimed in claim 2, wherein the display panel further comprises a first photoresist layer, the first photoresist layer overlies a surface of the electrode layer, and the first photoresist layer is provided with a second defect seat and a first photoresist patch layer corresponding in position to the first defect seat.

7. The display panel as claimed in claim 2, wherein the display panel further comprises a first photoresist layer, the first photoresist layer overlies a surface of the electrode layer, the first photoresist layer is provided with a second defect seat and a first photoresist patch layer corresponding in position to the first defect seat, and the transparent conductive patch layer employs a colloidal material.

8. The display panel as claimed in claim 2, wherein the display panel further comprises a first photoresist layer, the first photoresist layer overlies a surface of the electrode layer, the first photoresist layer is provided with a second defect seat and a first photoresist patch layer corresponding in position to the first defect seat, the transparent conductive patch layer employs a colloidal material, and the colloidal material is indium oxide, tin oxide, zinc oxide, or a mixture thereof.

9. The display panel as claimed in claim 2, wherein the display panel further comprises a second photoresist layer, the electrode layer overlies a surface of the second photoresist layer, and the second photoresist layer is provided with a third defect seat and a second photoresist patch layer corresponding in position to the first defect seat.

10. The display panel as claimed in claim 2, wherein the display panel further comprises a second photoresist layer, the electrode layer overlies a surface of the second photoresist layer, the second photoresist layer is provided with a third defect seat and a second photoresist patch layer corresponding in position to the first defect seat, and the transparent conductive patch layer employs a colloidal material.

11. The display panel as claimed in claim 2, wherein the display panel further comprises a second photoresist layer, the electrode layer overlies a surface of the second photoresist layer, the second photoresist layer is provided with a third defect seat and a second photoresist patch layer corresponding in position to the first defect seat, the transparent conductive patch layer employs a colloidal material, and the colloidal material is indium oxide, tin oxide, zinc oxide, or a mixture thereof.

12. The display panel as claimed in claim 2, wherein the substrate comprises a first substrate, the first substrate is provided with an active switch; the electrode layer comprises a pixel electrode layer coupled to the active switch; and the pixel electrode layer is provided with the first defect seat and the transparent conductive patch layer.

13. The display panel as claimed in claim 2, wherein the substrate comprises a first substrate, the first substrate is provided with an active switch; the electrode layer comprises a pixel electrode layer coupled to the active switch; the pixel electrode layer is provided with the first defect seat and the transparent conductive patch layer, and the transparent conductive patch layer employs a colloidal material.

14. The display panel as claimed in claim 2, wherein the substrate comprises a first substrate, the first substrate is provided with an active switch; the electrode layer comprises a pixel electrode layer coupled to the active switch; the pixel electrode layer is provided with the first defect seat and the transparent conductive patch layer, the transparent conductive patch layer employs a colloidal material, and the colloidal material is indium oxide, tin oxide, zinc oxide, or a mixture thereof.

15. The display panel as claimed in claim 2, wherein the substrate comprises a second substrate, the electrode layer comprises a common electrode layer overlying the second substrate; and the common electrode layer is provided with the first defect seat and the transparent conductive patch layer.

16. The display panel as claimed in claim 2, wherein the substrate comprises a second substrate, the electrode layer comprises a common electrode layer overlying the second substrate; the common electrode layer is provided with the first defect seat and the transparent conductive patch layer, and the transparent conductive patch layer employs a colloidal material.

17. The display panel as claimed in claim 2, wherein the substrate comprises a second substrate, the electrode layer comprises a common electrode layer overlying the second substrate; the common electrode layer is provided with the first defect seat and the transparent conductive patch layer, the transparent conductive patch layer employs a colloidal material, and the colloidal material is indium oxide, tin oxide, zinc oxide, or a mixture thereof.

18. The display panel as claimed in claim 2, wherein the display panel further comprises a first photoresist layer, the first photoresist layer overlies a surface of the electrode layer, the first photoresist layer is provided with a second defect seat and a first photoresist patch layer corresponding in position to the first defect seat; or the display panel further comprises a second photoresist layer, the electrode layer overlies a surface of the second photoresist layer, the second photoresist layer is provided with a third defect seat and a second photoresist patch layer corresponding in position to the first defect seat;

the substrate comprises a first substrate, the first substrate is provided with an active switch; the electrode layer comprises a pixel electrode layer coupled to the active switch; the pixel electrode layer is provided with the first defect seat and the transparent conductive patch layer; the substrate comprises a second substrate, the electrode layer comprises a common electrode layer overlying the second substrate; the common electrode layer is provided with the first defect seat and the transparent conductive patch layer;

the transparent conductive patch layer employs a colloidal material, and the colloidal material is indium oxide, tin oxide, zinc oxide, or a mixture thereof.

* * * * *